(12) United States Patent
Verhulst et al.

(10) Patent No.: US 8,148,220 B2
(45) Date of Patent: Apr. 3, 2012

(54) TUNNEL EFFECT TRANSISTORS BASED ON ELONGATE MONOCRYSTALLINE NANOSTRUCTURES HAVING A HETEROSTRUCTURE

(75) Inventors: Anne S. Verhulst, Houtvenne (BE); William G. Vandenberghe, Heverlee (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 0 days.

(21) Appl. No.: 13/286,936

(22) Filed: Nov. 1, 2011

(65) Prior Publication Data

US 2012/0045879 A1 Feb. 23, 2012

Related U.S. Application Data

(62) Division of application No. 11/855,930, filed on Sep. 14, 2007, now Pat. No. 8,072,012.

(60) Provisional application No. 60/845,006, filed on Sep. 15, 2006.

(51) Int. Cl.
*H01L 29/94* (2006.01)
*H01L 21/8238* (2006.01)

(52) U.S. Cl. ..................................... 438/197

(58) Field of Classification Search .......... 257/900, 257/902–903, 213–413, E21.19–E21.21, 257/E21.394–E21.458, E21.615–E21.694, 257/E29.049–E29.067, E29.237, E29.256–E29.26, 257/E29.299, 151–153, E29.125–E29.131, 257/E29.134–E29.138, E29.14–E29.161, 257/E29.275, E29.319, E29.315; 438/135, 438/142; 977/790, 700, 825
See application file for complete search history.

(56) References Cited

U.S. PATENT DOCUMENTS

| | | | |
|---|---|---|---|
| 5,313,484 A * | 5/1994 | Arimoto | 372/45.01 |
| 5,471,075 A | 11/1995 | Shekar et al. | |
| 7,425,491 B2 | 9/2008 | Forbes | |
| 7,446,372 B2 | 11/2008 | Forbes | |
| 7,491,995 B2 | 2/2009 | Forbes | |
| 7,579,653 B2 * | 8/2009 | Suh et al. | 257/347 |
| 7,714,386 B2 * | 5/2010 | Pesetski et al. | 257/347 |
| 2003/0098488 A1 * | 5/2003 | O'Keeffe et al. | 257/401 |
| 2003/0170930 A1 * | 9/2003 | Choi et al. | 438/99 |
| 2004/0262636 A1 | 12/2004 | Yang et al. | |

(Continued)

OTHER PUBLICATIONS

Bhuwalka et al., IEEE Transactions on Electron Devices, vol. 52, No. 7, Jul. 2005.

(Continued)

*Primary Examiner* — Dao H Nguyen
*Assistant Examiner* — Tram H Nguyen
(74) *Attorney, Agent, or Firm* — Knobbe Martens Olson & Bear LLP

(57) ABSTRACT

Tunnel field-effect transistors (TFETs) are regarded as successors of metal-oxide semiconductor field-effect transistors (MOSFETs), but silicon-based TFETs typically suffer from low on-currents, a drawback related to the large resistance of the tunnel barrier. To achieve higher on-currents an elongate monocrystalline nanostructure-based TFET with a heterostructure made of a different semiconducting material (e.g. germanium (Ge)) is used. An elongate monocrystalline nanostructure made of a different semiconducting material is introduced which acts as source (or alternatively drain) region of the TFET. The introduction of the heterosection is such that the lattice mismatch between silicon and germanium does not result in a highly defective interface. A dynamic power reduction as well as a static power reduction can result, compared to conventional MOSFET configurations. Multiple layers of logic can therefore be envisioned with these elongate monocrystalline nanostructure Si/Ge TFETs resulting in ultra-high on-chip transistor densities.

19 Claims, 12 Drawing Sheets

U.S. PATENT DOCUMENTS

| | | |
|---|---|---|
| 2005/0028860 A1* | 2/2005 | Sano et al. .................. 136/249 |
| 2005/0274992 A1 | 12/2005 | Appenzeller et al. |
| 2006/0138528 A1* | 6/2006 | Kang et al. ................... 257/321 |
| 2006/0258072 A1 | 11/2006 | Kavalieros et al. |
| 2006/0258076 A1* | 11/2006 | Mizushima et al. .......... 438/201 |
| 2007/0001232 A1 | 1/2007 | King et al. |
| 2007/0178650 A1 | 8/2007 | Chen et al. |
| 2008/0050881 A1 | 2/2008 | Chen et al. |
| 2008/0067495 A1 | 3/2008 | Verhulst |
| 2008/0067607 A1 | 3/2008 | Verhulst et al. |
| 2008/0303058 A1 | 12/2008 | Mori et al. |
| 2010/0133601 A1 | 6/2010 | Miyazaki et al. |

OTHER PUBLICATIONS

Glas, F. "Critical dimensions for the plastic relaxation of strained axial heterostructures in free-standing nanowires", Phys. Rev. B 74, 121302(R) (2006).

* cited by examiner

FRONT VIEW

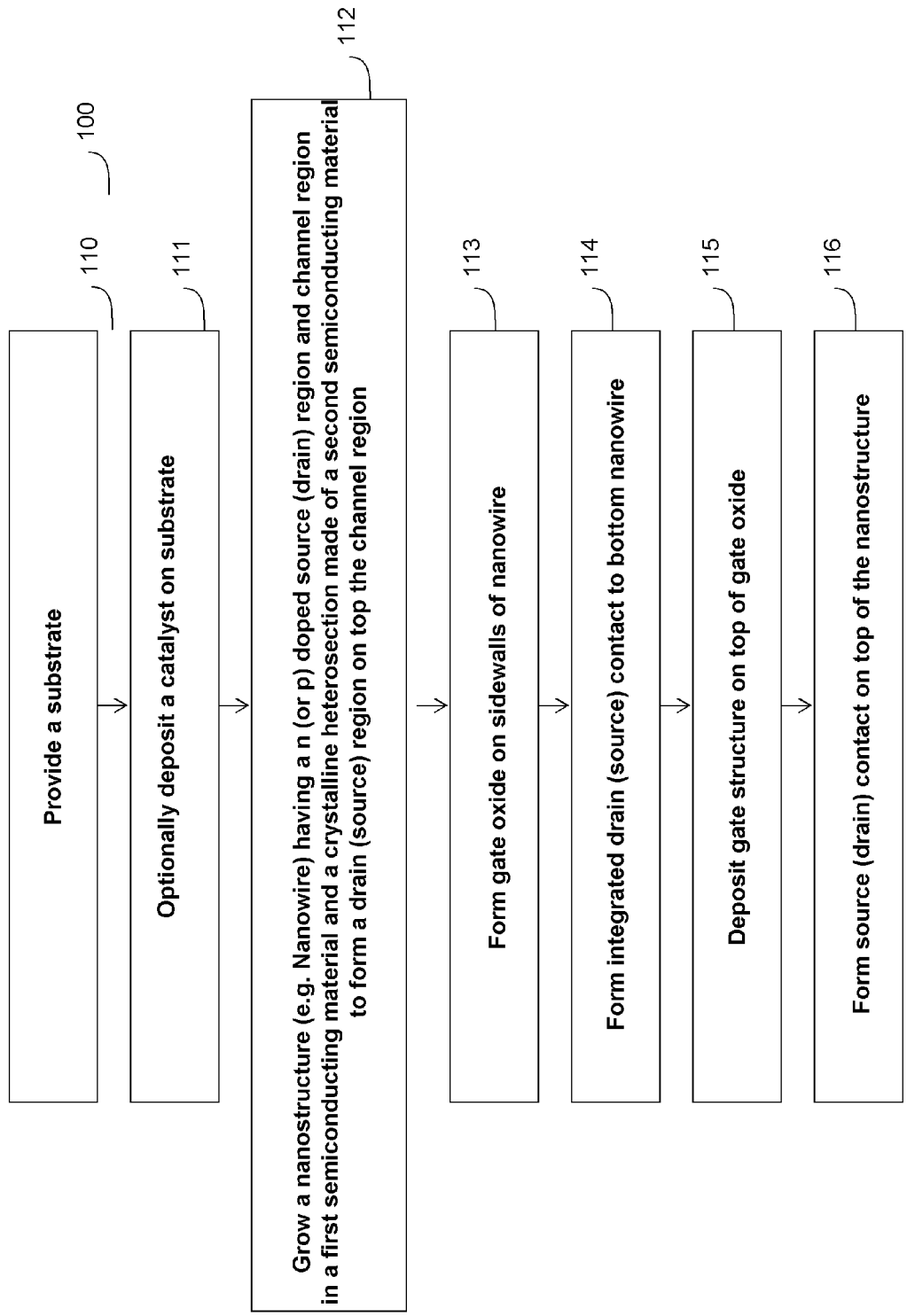

TUNNEL EFFECT TRANSISTORS BASED ON ELONGATE MONOCRYSTALLINE NANOSTRUCTURES HAVING A HETEROSTRUCTURE

CROSS-REFERENCE TO RELATED APPLICATIONS

This application is a division of U.S. application Ser. No. 11/855,930, filed Sep. 14, 2007, which claims the benefit under 35 U.S.C. §119(e) of U.S. provisional application Ser. No. 60/845,006 filed Sep. 15, 2006, the disclosures of which are hereby expressly incorporated by reference in their entirety and are hereby expressly made a portion of this application.

FIELD OF THE INVENTION

The present invention is related to the field of semiconductor devices and nanotechnology. More specifically, the invention is related to a nanostructure semiconductor device, more specifically to a tunnel field effect transistor having an elongate monocrystalline heterostructure nanostructure, e.g. nanowire, and a method for manufacturing such tunnel field effect transistor devices with integrated elongate monocrystalline nanostructures.

BACKGROUND OF THE INVENTION

Microelectronic devices are generally fabricated on semiconductor substrates as integrated circuits. A complementary metal-oxide-semiconductor (CMOS) field effect transistor is one of the core elements of the integrated circuits. Dimensions and operating voltages of CMOS transistors are continuously reduced, or scaled down, to obtain ever-higher performance and packaging density of the integrated circuits.

One of the problems due to the scaling down of CMOS transistors is that the power consumption keeps increasing. This is partly because leakage currents are increasing (e.g. due to short channel effects) and because it becomes difficult to decrease the supply voltage. The latter is mainly due to the fact that the subthreshold slope is limited to minimally about 60 mV/decade, such that switching the transistor from ON to OFF needs a certain voltage variation and therefore a minimum supply voltage.

Tunnel field-effect transistors (TFETs) are typically advertised as successors of metal-oxide semiconductor field-effect transistors (MOSFETs), because of their absence of short-channel effects and because of their resulting low off-currents. Another advantage of TFETs is that the subthreshold slope can be less than 60 mV/dec, the physical limit of conventional MOSFETs, such that potentially lower supply voltages can be used. However, TFETs typically suffer from low on-currents, a drawback related to the large resistance of the tunnel barrier.

In US 2005/0274992, a method of fabricating an improved TFET using nanowires is disclosed. The method comprises forming in a nanotube (i.e. a nanowire with axial opening) an n-doped region and a p-doped region that are separated by an undoped channel region of the transistor. Electrical contacts are provided for the doped regions and a gate electrode that is formed upon a gate dielectric layer is deposited on the channel region of the transistor. The proposed structure still has the disadvantage of introducing new materials (carbon nanotubes).

To increase the on-current of a silicon TFET, suggestions have been made in literature by Bhuwalka et al. (IEEE transactions on electron devices Vol. 52, No. 7, July 2005) to add a small (about 3 nm wide) section of highly-doped $Si_{1-x}Ge_x$ at the tunnel barrier. The $Si_{1-x}Ge_x$ has a smaller band gap than Si such that the tunnel barrier width decreases due to the presence of this section. However, these structures with the $Si_{1-x}Ge_x$ section can still not compete with conventional MOSFETs because of their low on-currents.

As a conclusion, there is still a need for an improved method of fabricating a nanowire tunnel field effect transistor.

SUMMARY OF THE INVENTION

Semiconductor device structures are provided with an improved architecture and having low power consumption using elongate monocrystalline nanostructures such as nanowires. A method for the manufacturing of such semiconductor device structures is also provided.

Creation of a tunnel field effect transistor is described having at least one elongate monocrystalline nanostructure, e.g. at least one nanowire, (further referred to as a NW-TFET), said elongate monocrystalline nanostructure comprising a channel region and a drain (or alternatively a source) region made of a first semiconductor material and a heterosection made of a second semiconductor material acting as a source (or alternatively a drain) region.

It is further an advantage of the NW-TFET of the preferred embodiments that Si based materials and process knowledge can be used to create the NW-TFET such that the NW-TFET can be easily processed and incorporated in current Si-based technology devices.

Preferred embodiments relate to micro and nanoelectronics and may be used for developing low power semiconductor device structures. Using the tunnel field effect transistor of the preferred embodiments it is possible to increase the number of transistors on a chip further. The elongate monocrystalline nanostructure tunnel field effect transistor, e.g. nanowire tunnel field effect transistor of some embodiments of the preferred embodiments can be based on current Si based technology and can therefore be easily incorporated in current devices using current state of the art technologies. The elongate monocrystalline nanostructure tunnel field effect transistor, e.g., nanowire tunnel field effect transistor, of some of the embodiments is distinguished from all analogous TFETs known in prior art by the integration of an appropriate heterosection. A heterosection is a section along the longitudinal axis of an elongate monocrystalline nanostructure, e.g. nanowire, which is made of a material which is different from the material of the main part of the elongate monocrystalline nanostructure. The heterosection can help enable an improved performance in terms of any or all of: high ON currents (the resistance associated with the tunnel barrier can be decreased by using a material with a very small bandgap for the heterosection and/or a material with a different electron affinity for the heterosection than the electron affinity of the material of the main part of the elongate monocrystalline nanostructure), low OFF currents (the off-current is determined by the material of the main part of the elongate monocrystalline nanostructure, and can be chosen independently of the material of the heterosection) and fast OFF-to-ON transition (as simulations have indicated, in the presence of a heterosection, whereby the heterosection material has a smaller bandgap than the material of the main part of the elongate monocrystalline nanostructure, or whereby the heterosection material has a different electron affinity from the electron affinity of the material of the main part of the elongate monocrystalline nanostructure, the OFF-to-ON transition becomes faster). The interface between the material of the main part of the elongate monocrystalline nanostructure and the heterosection can be substantially defect-free, i.e. it does not result in a highly defective interface, because this is an elongate monocrystalline nanostructure and the very small cross section allows for efficient lateral stress relaxation. An example is a silicon nanowire with a germanium heterosection, where the lattice mismatch between silicon and germanium does not result in a highly defective interface.

In a preferred embodiment, a Tunnel Field Effect Transistor (TFET) semiconductor device is provided. Said TFET comprises at least one elongate monocrystalline nanostructure, e.g. nanowire (to form a NW-TFET) or a semiconducting carbon nanotube, said elongate monocrystalline nanostructure further comprising at least one drain (alternatively source) region made of a first semiconductor material which is highly doped according to a first conductivity type, e.g. p doped (or n doped), at least one heterosection acting as source (alternatively drain) region made of a second semiconductor material which is highly doped according to a second conductivity type, e.g. n doped (or p doped) and at least one channel region made of a first semiconductor material which is lowly doped according to the first conductivity type or the second conductivity type, e.g. n doped or p doped, and which is situated in between the source and drain region. The latter embodiment is possible because an elongate monocrystalline nanostructure, e.g. nanowire, can have sufficiently defect-free heterosections of arbitrary length. The latter embodiment has the advantage that it requires one less processing step in the fabrication of the Tunnel Field Effect Transistor (NW-TFET), as the source region (or drain region) is made of only one material.

In an alternative embodiment, said heterosection can be made of a metal such as Al, W, Ta, Ti, Ru, Pd, Rh, Re, Pt, and alloys thereof, a silicide, a germanide, a metal-nitride such as TaN and TiN, a conductive oxide such as $RuO_2$ and $ReO_2$, a silicided metal such as $CoSi_2$, $NiSi_2$, a metal germanide and/or alloys and mixtures thereof.

The Tunnel Field Effect Transistor (NW-TFET) further comprises a gate structure, said gate structure being made of a gate dielectric, e.g. gate oxide, situated onto the channel region of the NW-TFET and a gate contact situated on top of the gate dielectric, e.g. gate oxide. The gate dielectric may be selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. In particular embodiments, the gate oxide is a high-k oxide such as hafnium oxide. The thickness of the gate dielectric may be in the range of 0.5 nm to 20 nm The gate contact may be made of a conductive material and is selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE). The gate contact is chosen such that a particular gate workfunction is obtained specifically for the chosen elongate monocrystalline nanostructure material, e.g. nanowire material, (first and second semiconductor material), gate dielectric and gate dielectric thickness. In particular embodiments the gate structure (containing the gate contact and gate dielectric) of the NW-TFET covers completely the channel region of the elongate monocrystalline nanostructure, e.g. nanowire.

The Tunnel Field Effect Transistor (NW-TFET) of some preferred embodiments further comprises an electrical contact on each of the source region and drain region. The electrical contact on each of the source region and drain region may be a conductive material which is selected from at least one of a silicide containing structure (NiSi, $CoSi_2$, $TiSi_2$, . . . ), a germanide containing structure, a metal containing structure, poly silicon or a combination thereof. In particular embodiments said electrical contact on each of the source region and drain region is a combination of a metal with a silicide.

The first semiconductor material in the NW-TFET of the preferred embodiments may be selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. In particular embodiments the first semiconductor material in NW-TFET of the preferred embodiments is silicon.

The second semiconductor material in the NW-TFET of the preferred embodiments may be made of a material that has a different lattice constant from the first semiconductor material of the NW-TFET. In particular embodiments said second semiconductor material is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. In particular embodiments the second semiconductor material in NW-TFET of the preferred embodiments has a smaller bandgap and/or a different electron affinity than the first semiconductor material. In particular embodiments the second semiconductor material in NW-TFET of the preferred embodiments is germanium or $Si_{1-x}Ge_x$ with $x>0.5$.

The diameter of the NW, perpendicular to its longitudinal axis, used in the NW-TFET of some embodiments of the preferred embodiments may be in the range of 1 nm up to 500 nm, for example the diameter of the NW used in the NW-TFET of preferred embodiments is between 2 and 200 nm.

The length of the NW, along its longitudinal axis used in the NW-TFET of some preferred embodiments may be in the range of 5 nm and 2 µm, for example the length of the NW used in the NW-TFET of preferred embodiments is between 10 nm and 1 µm.

The length of the heterosection in the NW-TFET of some preferred embodiments may be in the range of 10 nm and 500 nm.

The length of the channel region in the NW-TFET of some preferred embodiments may be in the range of 1 nm and 1000 nm, for example the length of the channel region in the NW-TFET of preferred embodiments is between 1 nm and 100 nm.

The doping level of the source region and drain region (or the heterosection acting as source or drain region) in the NW-TFET of some preferred embodiments may be in the range of $10^{18}$/cc to $10^{21}$/cc, for example the doping level of the source region and drain region in the NW-TFET is in the range of $10^{19}$/cc to $5\times10^{20}$/cc.

The doping level of the channel region in the NW-TFET of the preferred embodiments may be in the range of undoped up to $10^{16}$/cc, for example the doping level of the channel region in the NW-TFET is in the range of undoped up to $5\times10^{14}$/cc.

Furthermore a method for manufacturing a NW-TFET semiconductor device is disclosed whereby said method comprises the steps of:

providing a substrate lying in a plane, optionally providing on said substrate a catalyst, growing an elongate monocrystalline nanostructure, e.g. a nanowire structure, said elongate monocrystalline nanostructure having an integrated drain (alternatively source) region and a channel region made of a first semiconductor material, and a heterosection made of second material having a different lattice constant from the first semiconductor material and whereby said heterosection is acting as a source (alternatively drain) region, selectively doping said drain (alternatively source) region, channel region, and heterosection to the desired doping level and dopant type.

Further steps of some embodiments of the method can involve one or more of:

forming a (integrated) drain contact to the drain region of the elongate monocrystalline nano structure depositing on the side walls of the elongate monocrystalline nanostructure a gate dielectric, e.g. gate oxide, depositing on top of the gate dielectric a gate contact, and forming a source (alternatively drain) contact on top of the heterosection of the elongate monocrystalline nanostructure.

In a particular embodiment, the substrate used for manufacturing a NW-TFET is a Si wafer.

In preferred embodiments, said first semiconductor material is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. In a particular embodiment said first semiconductor material is silicon.

In a particular embodiment, said heterosection is made of a second semiconductor material, whereby said second semiconductor material is such that it has a different lattice constant from the first semiconductor material of the elongate monocrystalline nanostructure, e.g. nanowire.

In preferred embodiments, said second semiconductor material is selected from at least one of the group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. The second semiconductor material may have a smaller bandgap and/or a different electron affinity than the first semiconductor material. In particular embodiments, said second semiconductor material is germanium or $Si_{1-x}Ge_x$ with x>0.5.

Alternatively, said heterosection can be made of metals (Al, W, Ta, Ti, Ru, Pd, Rh, Re, Pt, and alloys thereof), silicides, germanides, metal-nitrides such as TaN and TiN, conductive oxides such as $RuO_2$ and $ReO_2$, silicided metals such as $CoSi_2$, $NiSi_2$, metal germanides and alloys and mixtures thereof.

In preferred embodiments, the diameter of the elongate monocrystalline nanostructure, e.g. nanowire, is between 1 and 500 nm. In particular embodiments, the diameter of the elongate monocrystalline nanostructure, e.g. nanowire, is between 2 and 200 nm.

In preferred embodiments, the length of the elongate monocrystalline nanostructure, e.g. nanowire, is between 5 nm and 2 µm. In particular embodiments, the length of the elongate monocrystalline nanostructure, e.g. nanowire, is between 10 nm and 1 µm.

In preferred embodiments, the gate dielectric is selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. In particular embodiments the gate oxide is a high-k oxide such as hafnium oxide.

In preferred embodiments, the gate contact is made of a conductive material and is selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular embodiments the gate contact is made of a metal of which the workfunction has been engineered specifically for the chosen elongate monocrystalline nanostructure material, e.g. nanowire material (first and second semiconductor material).

In preferred embodiments, the source and drain contacts are made from a conductive material which is selected from at least one of a silicide containing structure (NiSi, $CoSi_2$, Ti $Si_2$, ... ), a germanide containing structure, a metal containing structure, poly silicon or a combination thereof. In a particular embodiment said source and drain is a combination of a metal with a silicide.

In preferred embodiments, the length of said heterosection acting as source (alternatively drain) region is in the range of 10 nm up to 500 nm.

In preferred embodiments, the length of said channel region is in the range of 1 nm to 1000 nm. In particular embodiments the length of said channel region is in the range of 1 nm to 100 nm.

In preferred embodiments, the thickness of the gate dielectric is in the range of 0.5 nm to 20 nm.

In preferred embodiments, the doping level of the drain (alternatively source) region and heterosection acting as source (alternatively drain) region is in the range of $10^{18}$/cc to $10^{21}$/cc. In particular embodiments the doping level of the drain (alternatively source) region and heterosection acting as source (alternatively drain) region is in the range of $10^{19}$/cc to $5 \times 10^{20}$/cc.

In preferred embodiments, the doping level of the channel region is in the range of undoped up to $10^{16}$/cc doping. In particular embodiments the doping level of the channel region is in the range of undoped up to $10^{14}$/cc doping.

For the application in tunnel field-effect-transistor (TFET) devices said elongate monocrystalline nanostructure, e.g. nanowire, forms the channel and source/drain regions of the tunnel field-effect transistor.

The above and other characteristics, features and advantages of the preferred embodiments will become apparent from the following detailed description, taken in conjunction with the accompanying drawings, which illustrate, by way of example, the preferred embodiments. This description is given for the sake of example only, without limiting the scope of the invention. The reference figures quoted below refer to the attached drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIG. 4 illustrates a flow diagram of a method for fabricating the NW-TFET of the preferred embodiments;

DETAILED DESCRIPTION OF THE PREFERRED EMBODIMENT

Figure 1:
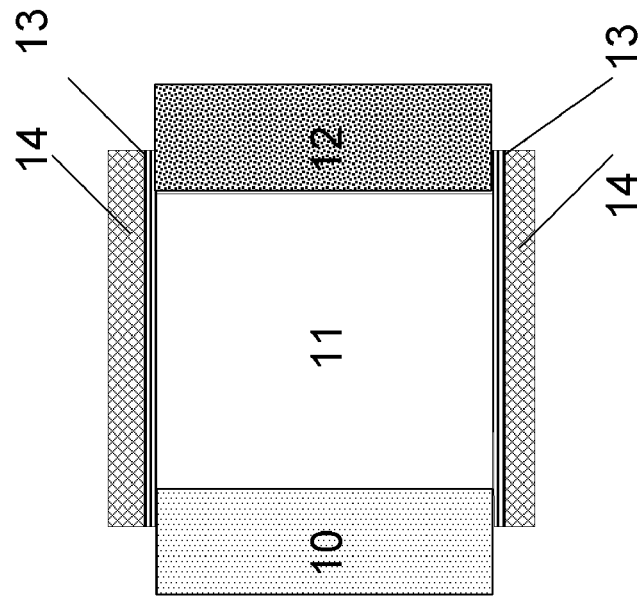
FIG. 1 (PRIOR ART) shows a schematic diagram of a TFET, including source 10, channel 11, drain 12, gate 14, and gate oxide 13.

Embodiments of the present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

Whenever reference is made hereinafter to a particular dopant type, this is done for the ease of explanation only and is not intended to limit the invention. It is to be understood that in the examples given herein below, materials and dopant types may be replaced by other suitable materials and dopant types, without changing the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims. In particular, some embodiments of the invention will be described with reference to nanowires, however, this is not intended to limit the invention, and is intended to encompass any example of an elongate monocrystalline nanostructure, which may include nanorods, nanotubes, nanowhiskers and other elongated substantially cylindrical or polygonal structures having a longitudinal axis.

At least some preferred embodiments are concerned with the problem of too low ON currents in existing tunnel field effect transistors (TFET). To solve that problem a heterosection made of different material than the main part of the TFET is introduced, said heterosection replacing the source (or alternatively drain) region of the TFET. Some embodiments of said TFET can be further characterized as a TFET whereby a heterosection is introduced which replaces at least one of the source and drain region and is made of another semiconductor material compared to the semiconductor material of the main part of the TFET. The use of a different material for the main part of the TFET and the heterosection implies that the lattice constant will be different. As an example: if SiGe with a very small Ge content is used for the heterosection, then the lattice constant will be different from the lattice constant of pure Si used for the TFET, but the difference will be very small, such that it can still be grown on top of Si without an excessive amount of dislocations. A TFET device whereby the channel region and the source/drain region and heterosection are fabricated in a nanowire is further referred to in this application as a NW-TFET.

At least some of the preferred embodiments relate to the creation of semiconductor devices and more specifically to the creation of a nanowire Tunnel-Field Effect Transistor (NW-TFET) on a semiconductor substrate. A NW-TFET structure is disclosed whereby the nanowire comprises a first source/drain region made of a first semiconductor material and having a first doping level and first doping composition. The NW-TFET further comprises a second source/drain region referred to as heterosection, said heterosection made of a second semiconductor material and having a second doping level and second doping composition. In preferred embodiments, a p-doped region is situated at the one end of the nanowire and an n-doped region is situated in the other end of the nanowire. The heterosection is made of a second semiconductor material and is such that it has a different lattice constant from the first semiconductor material of the nanowire, and whereby the resulting NW-TFET has an improved performance compared to the TFET consisting of the semiconductor nanowire without a heterosection. This is because the subthreshold slope can be steeper, which allows reducing the power supply and therefore the power consumption.

In a first preferred embodiment, NW-TFETs using semiconducting nanowires are disclosed. TFETs using nanowires are known from the prior art (e.g. in US 2005/0274992) whereby said nanowire comprises an n-doped region and a p-doped region which is separated by an undoped channel region made of the same semiconducting material. However, none of the prior art devices includes a heterosection acting as the source (or drain) region and whereby the heterosection is such that it has a different lattice constant than the main semiconductor material of the nanowire. This can enable a performance improvement in that low ON currents (less than the International Technology Roadmap for Semiconductors ITRS roadmap predictions, which are currently predicting ON currents on the order of 1 mA/μm for a low power operating technology), a typical drawback related to the large resistance of the tunnel barrier in semiconductors with a bandgap of at least 1 eV (e.g. silicon), can be reduced or eliminated.

Figure 5A:
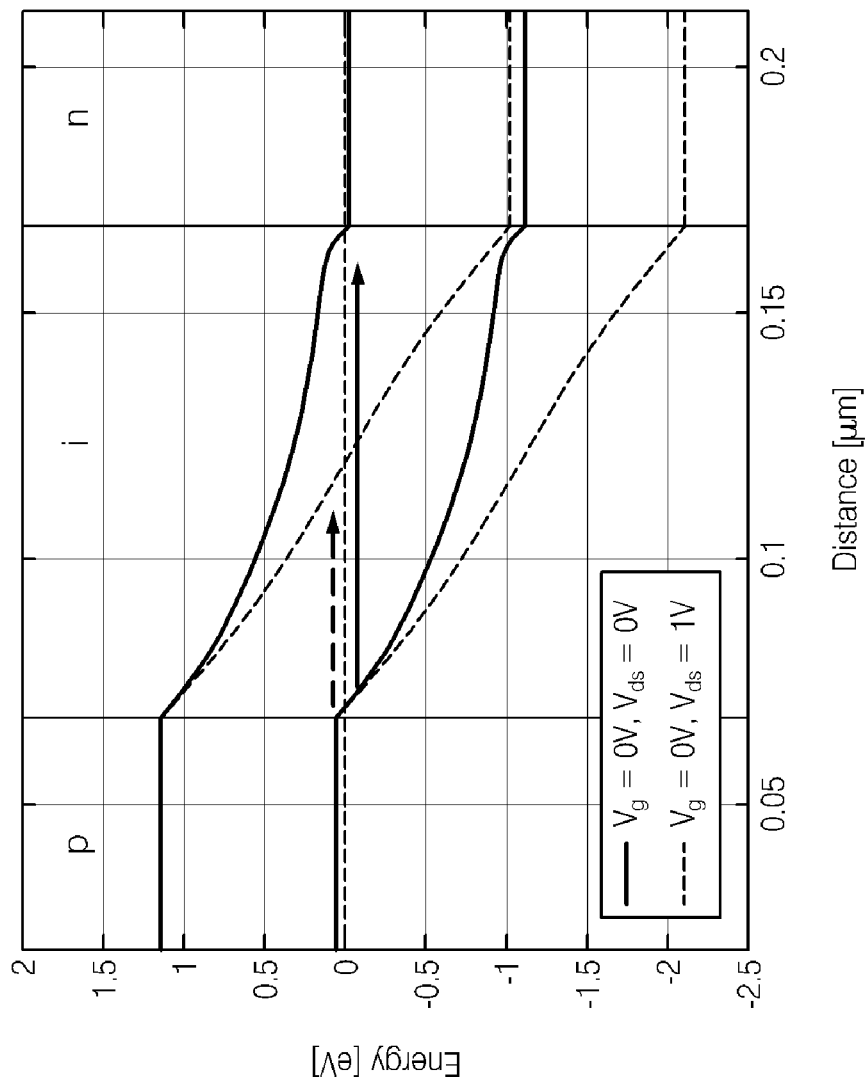
FIG. 5A shows a typical energy band diagram of a TFET as shown in FIG. 1 (prior art) without and with applied drain-source bias (no gate bias applied). The arrows indicate the tunnel barrier which needs to be crossed.
Figure 5B:
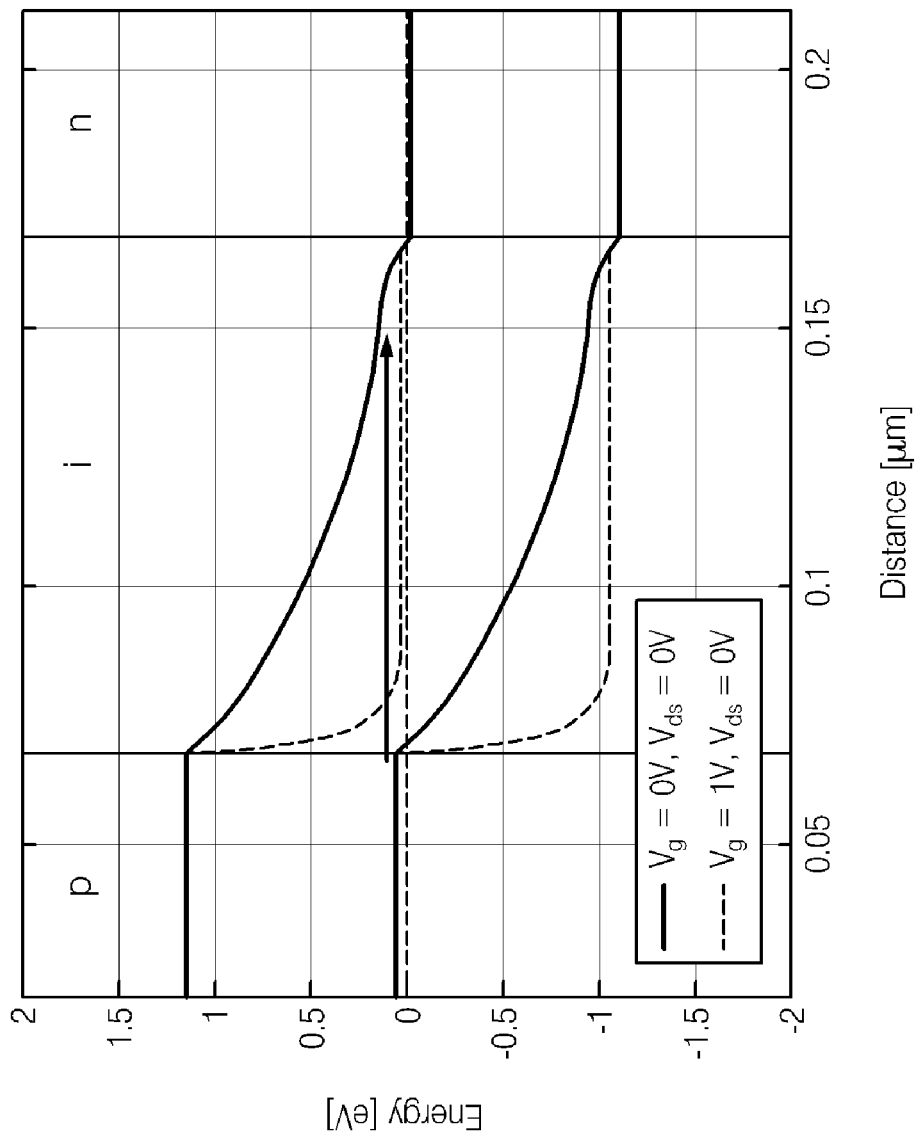
FIG. 5B shows a typical energy band diagram of a TFET as shown in FIG. 1 (prior art) without and with applied gate bias (no drain-source bias applied). The arrows indicate the tunnel barrier which needs to be crossed.

A traditional TFET (without having nanostructures) as shown in FIG. 1 and described in the prior art is in fact a p-i-n diode, which is reverse biased and gated. The reverse bias turns the diode off. However, when a sufficiently large reverse bias is applied, quantum mechanical tunneling occurs of electrons from the valence band (in the p-doped section) to the conduction band (in the n-doped section), an effect usually called Zener breakdown. This is shown in FIG. 5A, which displays the band diagram of an unbiased and a reverse biased p-i-n diode. The arrow in FIG. 5A indicates the tunnel barrier which needs to be crossed. In a TFET, this tunnel effect is desired and represents the on-state of the transistor. The amount of current in the on-state is determined by the tunnel barrier width. The barrier width is the smallest when there is a highly doped region at either side of the tunnel barrier. This requires a highly doped source (or drain) section and a gate voltage such that a large carrier concentration is created in the intrinsic region next to the source (or drain) (see FIG. 5B for the effect of a gate bias on the tunnel barrier width). The tunnel barrier width further decreases with decreasing band gap. When comparing this device with a MOSFET, there are a few differences, but many similarities. The MOSFET has either a p-doped source and drain (p-MOSFET) or an n-doped source and drain (n-MOSFET), whereas the TFET has a p-doped source and an n-doped drain, or vice versa. The channel, however, is lowly doped in both devices, and a gate voltage is applied to create a high-mobility channel. Therefore, if the resistance associated with the tunnel barrier can be made sufficiently small, the on-current of a TFET can in principle become comparable to the on-current of a MOSFET (usually the on-current of a TFET is, however, significantly smaller than the on-current of the corresponding MOSFET). The off-currents of a TFET are typically very small, which is due to the presence of the tunnel barrier. The conventional MOSFET on the other hand suffers from short-channel effects which results in source-drain leakage currents, especially as the device size scales down.

The NW-TFET of some preferred embodiments solves or mitigates the problem of low ON currents by introducing a heterosection at the tunnel barrier of the channel, said heterosection is made of a highly doped material and may have a smaller bandgap than the material used for the other regions of the nanowire and/or which may have a different affinity from the material used for source, drain and channel regions.

The NW-TFET of some preferred embodiments can further be characterized as a TFET having at least one nanowire. Said nanowire comprises the source region, channel region and drain regions of the TFET device whereby one of the source and drain regions is a heterosection and whereby said heterosection is made of a different material than the material used for the other regions of the nanowire. More specifically said heterosection can be or acts as the source region of the nanowire. Alternatively said heterosection can be the drain region of the nanowire.

The nanowire in the NW-TFET of some preferred embodiments can be characterized as a semiconducting nanowire wherein the diameter of the nanowire is between 1 and 500 nm and the length of the nanowire is between 5 nm and 2 μm. In particular embodiments the diameter of the nanowire is between 2 nm and 200 nm and the length of the nanowire is between 10 nm and 1 μm.

According to preferred embodiments, the source region of the NW-TFET is made of a first semiconductor material which is highly p doped in case of a n-type NW-TFET, or alternatively in case of a p-type NW-TFET said source region is highly n doped. The drain region of the NW-TFET is made of a heterosection which is made of a second semiconductor material which is highly n doped in case of a n-type NW-TFET, or alternatively in case of a p-type NW-TFET said source region is highly p doped. In preferred embodiments, the doping level of the source region and the heterosection acting as drain region is in the range of $10^{18}$/cc to $10^{21}$/cc. The doping level of source region and the heterosection acting as drain region may for example be in the range of $10^{19}$/cc to $5.10^{20}$/cc. Said doping can be performed during the growth of the nanowire (e.g. by adding the appropriate doping gases during the growth) or after growth of the nanowire.

According to preferred embodiments, the drain region of the NW-TFET is made of a first semiconductor material which is highly n doped in case of an n-type NW-TFET, or alternatively in case of a p-type NW-TFET said source region is highly p doped. The source region of the NW-TFET is made of a heterosection which is made of a second semiconductor material which is highly p doped in case of a n-type NW-TFET, or alternatively in case of a p-type NW-TFET said source region is highly n doped. In preferred embodiments the doping level of the drain region and the heterosection acting as source region is in the range of $10^{18}$/cc to $10^{21}$/cc. The doping level of the drain region and the heterosection acting as source region may for example be in the range of $10^{19}$/cc to $5.10^{20}$/cc. Said doping can be performed during the growth of the nanowire (e.g. by adding the appropriate doping gases during the growth) or after growth of the nanowire.

The channel region of the NW-TFET is also fabricated in the nanowire and is also made of a first semiconductor material. The channel region of the NW-TFET is situated in between the source and drain region. In preferred embodiments the doping level of the channel region is in the range of undoped up to $10^{16}$/cc doping. The doping level of the channel region may for example be in the range of undoped up to $10^{14}$/cc doping. Said doping can be performed during the growth of the nanowire (e.g. by adding the appropriate doping gases during the growth) or after growth of the nanowire.

The first semiconductor material used to fabricate at least one of the source/drain region and channel region of the nanowire is selected from at least one of group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. In particular embodiments said first semiconductor material is silicon.

The length of the channel region may be in the range of 1 nm to 1000 nm, for example in the range of 1 nm to 100 nm.

The heterosection may be made of a second semiconductor material whereby said second semiconductor material is such that it has a different lattice constant from the first semiconductor material of the nanowire. Said second semiconductor material is highly doped and is selected from at least one of the group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. In particular embodiments said second semiconductor material is germanium or $Si_{1-x}Ge_x$ with x>0.5.

Alternatively, said heterosection can be made of metals (Al, W, Ta, Ti, Ru, Pd, Rh, Re, Pt, and alloys thereof), silicides, germanides, metal-nitrides such as TaN and TiN, conductive oxides such as $RuO_2$ and $ReO_2$, silicided metals such as $CoSi_2$, $NiSi_2$, metal germanides and alloys and mixtures thereof.

The length of the heterosection may be in the range of 10 nm up to 500 nm,

Onto the sidewalls of the nanowire, more specifically onto the sidewalls of the channel region of the nanowire, a gate structure is situated. Said gate structure can comprise a gate oxide (also referred to as gate dielectric) and a gate electrode (also referred to as gate contact). The gate oxide is making direct contact to the channel region of the nanowire; more specifically said gate oxide completely covers the outer sidewalls of the channel region. To ensure such a complete coverage, a small overlap of the gate oxide with the highly-doped drain and source region is desirable. Onto the gate oxide, a gate contact is deposited, said gate contact is thus situated on top of said gate oxide and may be covering the whole gate oxide. The gate structure, comprising gate oxide and gate contact, as described above can also be referred to as an all around gate structure.

The gate oxide may be selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. In particular embodiments said gate oxide is a high-k oxide such as hafnium oxide. The thickness of the gate oxide may be in the range of 0.5 nm to 20 nm.

The gate contact may be made of a conductive material and may be selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular embodiments said gate contact is made of a metal of which the workfunction has been engineered specifically for the chosen nanowire material, the gate oxide material and gate oxide thickness (first and second semiconductor material) in order to get the desired threshold voltage of the T-FET.

The NW-TFET further comprises an electrical contact on each of the source region and drain region (whereby one of the source and drain region is a heterosection). Said electrical contact on each of the source region and drain region is a conductive material which is selected from at least one of a silicide containing structure (NiSi, $CoSi_2$, $TiSi_2$, . . . ), a germanide containing structure, a metal containing structure, poly silicon or a combination thereof. In particular embodiments said electrical contact on each of the source region and drain region is a combination of a metal with a silicide.

In integrated circuits, the nanowire tunnel field effect transistor of the preferred embodiments may be used as either an n-type transistor device or a p-type transistor device.

Figure 2:
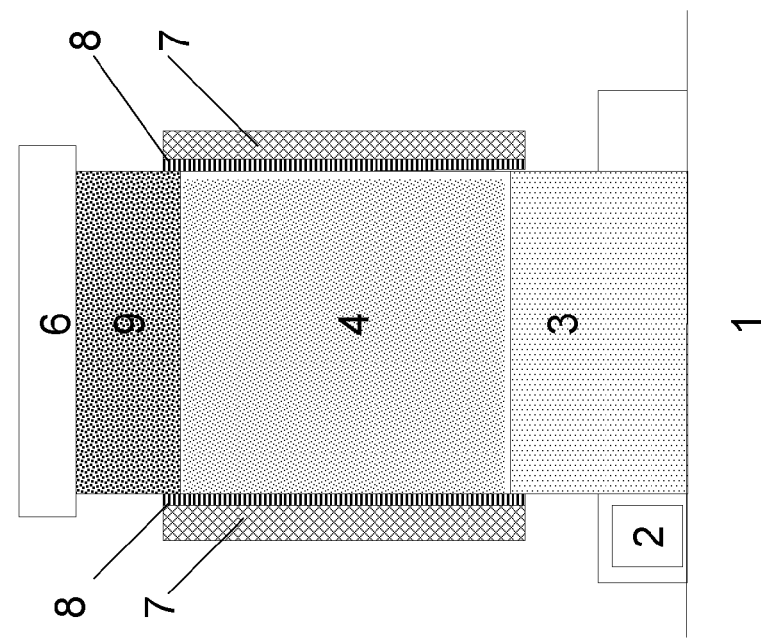
FIG. 2 illustrates a cross-section of the NW-TFET structure according to a preferred embodiment, including drain contact 2, drain region 3, channel region 4, source contact 6, herterosection 9, gate 7, and gate oxide 8.
Figure 3:
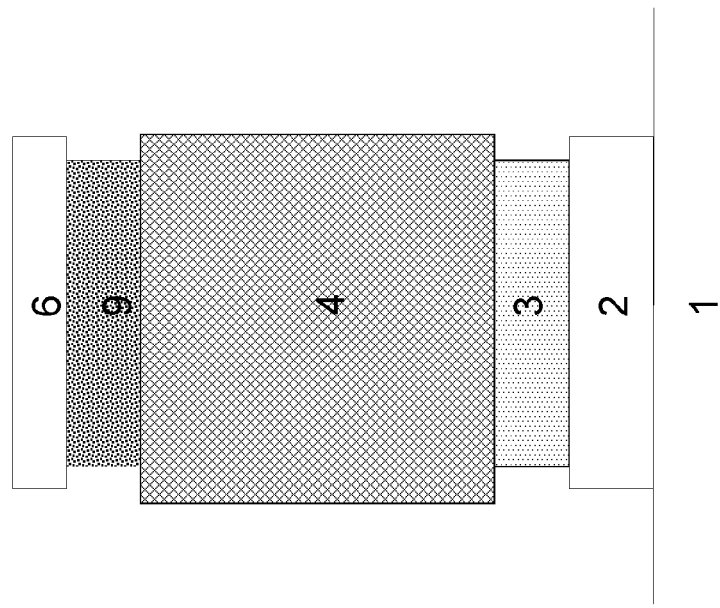
FIG. 3 illustrates a front view of the NW-TFET structure according to a preferred embodiment, including substrate 1, drain contact 2, drain region 3, channel region 4, source contact 6, and heterosection 9.

FIG. 2 illustrates a cross-section of the NW-TFET structure according to a preferred embodiment and FIG. 3 illustrates a front view of the NW-TFET structure according to a preferred embodiment.

In the example illustrated, the heterosection 9 can be partly covered by the gate structure 7, Band partially outside of the gate structure 7, 8 depending on the length of the heterosection.

In a second aspect of the preferred embodiments, a method is provided for the fabrication of a nanowire Tunnel Field Effect transistor. Hereinafter, the method according to a preferred embodiment will be illustrated for a device according to an embodiment, i.e. for a n-type NW-TFET comprising at least one vertical nanowire as shown in FIG. 2 (cross section) and FIG. 3 (front view). It has to be understood that this is not limiting the invention and that the method may also be applied to create a p-type NW-TFET comprising at least one vertical nanowire.

An embodiment of a processing method is schematically illustrated in a flowchart 100 shown in FIG. 4 and will be described in detail below. It has, however, to be understood that this is only an example of a suitable method for forming a device according to the preferred embodiments and that the sequence of the process steps as described hereinafter is not limiting the invention.

In a first step 110, a substrate 1 is provided. Said substrate 1 may be a semiconductor substrate such as a silicon substrate or a silicon on insulator (SOI) substrate but any other suitable substrate can be used as well such as, for example, glass, ceramics, etc. If needed a catalyst can be deposited onto the substrate (111), the requirement of catalyst particles depends on the technique used to form the nanowire.

In a next step 112, a nanowire is grown, e.g. by means of a VLS (Vapor-Liquid-Solid) process, but also any other suitable technique known by a person skilled in the art may be used to form the nanowires according to the preferred embodiments. For example, the nanowire may be grown using techniques such as, for example, CVD (Chemical Vapor Deposition), MOCVD (Metal Organic Chemical Vapor Deposition), or PECVD (plasma enhanced chemical vapor deposition) processes. Alternatively, also PLD (Pulsed Laser Deposition), ECD (Electrochemical Deposition), e-beam or MBE (Molecular Beam Epitaxy) processes may be used to grow the nanowires.

During growth of the nanowire, different regions need to be created to form the drain region, the channel region and the source region of the nanowire. The different regions in the nanowire can be doped during the growth process to obtain an n-type or p-type region. Alternatively, the doping of the nanowire may be performed after growth of the nanowire by means of an additional doping step. The doping in one specific region, e.g. source region/drain region is uniform in particular embodiments, but may also have a non-uniform doping profile.

During growth of the nanowire, first a drain region 3 (or alternatively a source region) needs to be created. Said drain region 3 is made of a first semiconductor material which is highly doped with a dopant of a first conductivity type e.g. n doped in case of a n-type NW-TFET, or alternatively in case of a p-type NW-TFET said drain region is highly p doped. The doping level of the source region may be in the range of $10^{18}$/cc to $10^{21}$/cc, for example the doping level of the source region is in the range of $10^{19}$/cc to $5.10^{20}$/cc.

Subsequently, the channel region of the NW-TFET is formed in the nanowire. Said channel region is preferably made of the first semiconductor material, although other suitable/compatible materials can be used. The doping level of the channel region may be in the range of undoped up to $10^{16}$/cc doping, for example the doping level of the channel region is in the range of undoped up to $10^{14}$/cc doping.

Next, a heterosection 9 is formed onto the channel region 4, said heterosection acts as the source region of the NW-TFET (or alternatively as the drain region). The heterosection 9 is made of a second semiconductor material which is such that it has a different lattice constant compared to the first semiconductor material used to form the main part of the nanowire. Said second semiconductor material is highly doped with a second conductivity type. Said second semiconductor material may be selected from at least one of the group IV materials such as Si, Ge, C and binary compounds thereof, or group III/V materials such as In, Ga, As, Sb, Al, P, B, N and binary, tertiary and quaternary compounds thereof or group II/VI materials such as Cd, Zn, S, Se, Te, O and binary, tertiary and quaternary compounds thereof. In particular embodiments said second semiconductor material is germanium or $Si_{1-x}Ge_x$ with x>0.5. The doping level of the heterosection is such that the heterosection can function as a source (or alternatively drain) region and is preferably in the range of $10^{18}$/cc to $10^{21}$/cc, for example the doping level of the heterosection is more preferably in the range of $10^{19}$/cc to $5 \times 10^{20}$/cc.

Alternatively, said heterosection can be made of metals (Al, W, Ta, Ti, Ru, Pd, Rh, Re, Pt, and alloys thereof), silicides, germanides, metal-nitrides such as TaN and TiN, conductive oxides such as $RuO_2$ and $ReO_2$, silicided metals such as $CoSi_2$, $NiSi_2$, metal germanides and alloys and mixtures thereof.

In a next step 113, a gate oxide needs to be formed onto the sidewalls of the nanowire, more specifically onto the sidewalls of the channel region of the nanowire. Said gate structure comprises a gate oxide 8 (also referred to as gate dielectric). First the gate oxide 8 is formed and deposited directly onto the channel region 4 of the nanowire 113. Said gate oxide 8 may completely cover the outer sidewalls of the channel region 4. To obtain a complete coverage of the channel region, a small overlap of the gate oxide with the highly-doped drain and source region is desirable. The gate oxide can be restricted to part of the nanowire (i.e. channel region), by means of a sacrificial layer, which is etched away before the oxide deposition (this implies that e.g. other materials are deposited onto the wafer after nanowire growth, such that the nanowire is embedded in other materials. This should be done in such a way that a sacrificial layer lines up with the channel region of the nanowire. After removal of the sacrificial material, a dielectric, e.g. an oxide, can be deposited onto the nanowire channel region.

In a next step an integrated drain contact is formed on the bottom of the nanowire, contacting the drain region 3.

A gate contact (electrode) is formed onto the gate dielectric 114, said gate contact is deposited on top of said gate dielectric, e.g. gate oxide, and can cover the whole gate oxide.

The gate dielectric may be selected from at least one of silicon based oxide (e.g. silicon dioxide, silicon oxy nitride) aluminum oxide, high-k oxides (oxides, nitrided oxides), silicates and nitrided silicates of transition metals such as Hf, Ta, Ti, Nb, V, Y, Zr. In particular embodiments said gate oxide is a high-k oxide such as hafnium oxide. The thickness of the gate oxide may be in the range of 0.5 nm to 20 nm.

The gate contact may be made of a conductive material and may be selected from at least one of poly silicon, poly germanium, metals such as Al, W, Ta, Ti, Ru, Pd, Rh, Re, Pt, and alloys thereof, metal-nitrides such as TaN and TiN, metal-silicon nitrides such as TaSiN, conductive oxides such as $RuO_2$ and $ReO_3$, fully silicided metals (FUSI) such as $CoSi_2$, NiSi and $TiSi_2$, fully germanided metals (FUGE), workfunction tunable metals, engineered materials to obtain a particular gate workfunction. In particular embodiments said gate contact is made of a metal of which the workfunction has been engineered specifically for the chosen nanowire material, the gate oxide material and gate oxide thickness.

Finally 115 electrical contact is formed on the heterosection (acting as source region) situated on top of the nanowire. Said electrical contact may be made from a conductive material which is selected from at least one of a silicide containing structure (NiSi, $CoSi_2$, $TiSi_2$, . . . ), a germanide containing structure, a metal containing structure, poly silicon or a combination thereof. In particular embodiments said electrical contact is a combination of a metal with a silicide.

In case the nanowire is not doped during the growth process, an extra doping step may be advantageous. For example, implantation of dopant elements followed by activation of the dopant elements by e.g. annealing can be applied to achieve n-type or p-type region in the nanowire. Alternatively, a layer, which is also referred to as dopant layer and which comprises dopant elements can be deposited or a dopant metal can be selectively deposited, e.g. with electrochemical deposition, onto the nanowire regions (not shown). An anneal step may then be applied so as to incorporate the dopant into the nanowire region, resulting in an n-type or p-type region.

The whole processing sequence to obtain a NW-TFET, in the example shown in FIG. 2 for a n-type NW-TFET, as described in the previous steps can be repeated to build a second NW-TFET structure on top of the existing NW-TFET structure starting on the drain contact. In case the first NW-TFET structure is an n-type NW-TFET structure, the second structure may for example be a p-type NW-TFET structure.

EXAMPLES

Example 1

Figure 6A:
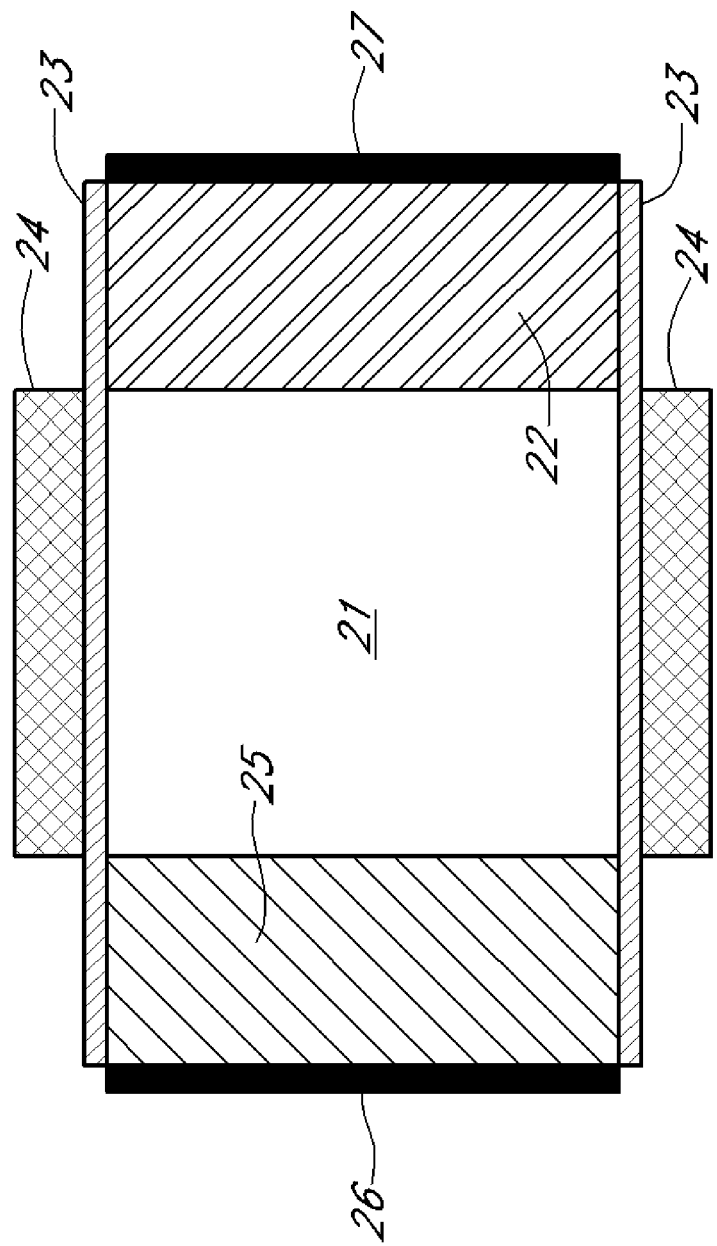
FIG. 6A shows a TFET structure used for the simulations of FIG. 6B, including channel region 21, drain region 22, gate oxide 23, gate 24, heterosection 25, source contact 26, and drain contact 27. The structure is 2-dimensional and has a double-gate. The height of the central part (between the oxides) is 100 nm, and the height of the hafnium oxide is 4 nm. The width of the highly p-doped heterosection is 30 nm, the width of the channel section is 100 nm, and the width of the highly n-doped section is 30 nm. The heterosection is made of either $Si_0Ge_1$ or Ge.

Simulations with Device Simulator MEDICI to Illustrate the Effect of Electron Affinity on a (Silicon) N-Type NW-TFET with a Highly P-Doped Ge Heterosection The simulations are performed with device simulator "MEDICI" to illustrate the effect of electron affinity on a (silicon) n-type NW-TFET with a highly p-doped Ge heterosection. The NW-TFET used for the simulation is shown in FIG. 6A. The NW-TFET structure is 2-dimensional and has a double-gate 24. The height of the central part (between the oxides) is 100 nm, and the height of the hafnium oxide 23 is 4 nm. The width of the highly p-doped heterosection 25 which forms the source region is 30 nm, the width of the channel region 21 is 60 nm, and the width of the highly n-doped drain 22 section is 30 nm. The heterosection 25 is made of either $Si_0Ge_1$ or Ge. The definition of $Si_0Ge_1$ in MEDICI is: an artificial material with the bandgap of Ge but with the electron affinity of Si. The doping concentrations and dopant type in the NW-TFET used to perform the simulations are summarized in Table 1.

TABLE 1

Doping concentrations and dopant type in the NW-TFET used to perform the simulations.

| Nanowire region | Dopant type/ concentration | Semiconductor material |
| --- | --- | --- |
| Heterosection source region | p-type, $10^{20}$/cc | Ge or $Si_0Ge_1$ |
| Channel region | n-type, $10^{13}$/cc | Si |
| Drain region | n-type, $10^{20}$/cc | Si |

Figure 6B:
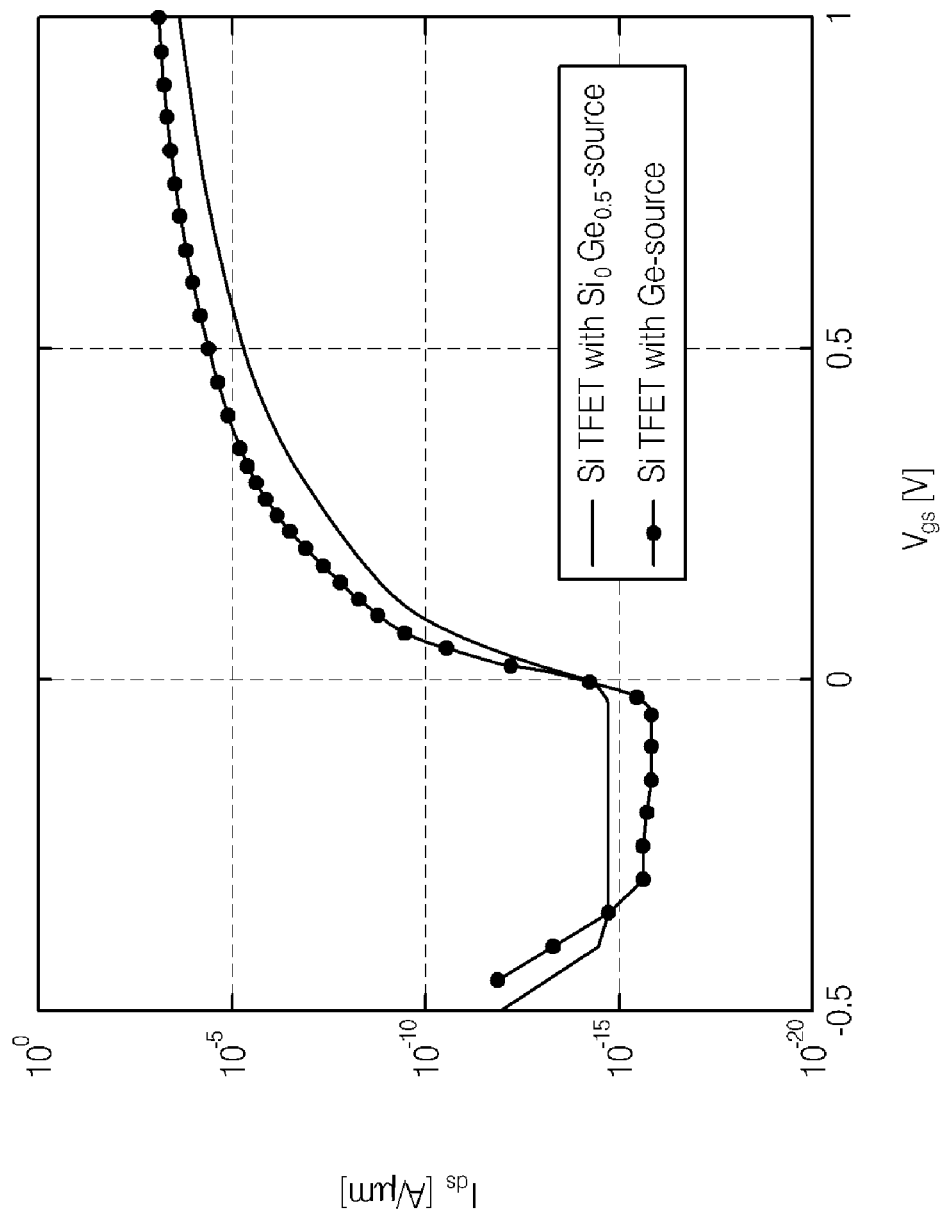
FIG. 6B illustrates the source-drain current $I_{ds}$ as a function of gate voltage $V_{gate}$ for the TFET structure as shown in FIG. 6A with a $Si_0Ge_1$ heterosection and a Ge heterosection. The voltage $V_{ds}$=1 V for all curves.

The electrical characteristics of the NW-TFET structure as shown in FIG. 6A are presented in FIG. 6B. The Ge-curve has been shifted to the right in order for the onset of tunneling to occur at the same gate voltage ($V_{gs}=0$ V) as the $Si_0Ge_1$-curve, such that a better comparison of both curves is possible. It can be observed that for the NW-TFET with the Ge heterosection, a higher on-current and a steeper subthreshold slope are achieved than for the NW-TFET with the $Si_0Ge_1$ heterosection. This is due to the fact that the tunnel barrier width decreases because the electron affinity of Ge in the heterosection source region is smaller than the electron affinity of Si in the channel region, whereas for $Si_0Ge_1$ the electron affinity is the same as for Si. The simulations of FIG. 6B therefore illustrate that not only the bandgap of the material is important, but also the electron affinity. The simulations further illustrate that in case of a p-doped heterosection which forms part of the source region of an n-type NW-TFET, the electron affinity of the heterosection is for example smaller than the electron affinity of the main part of the nanowire.

Example 2

Figure 7A:
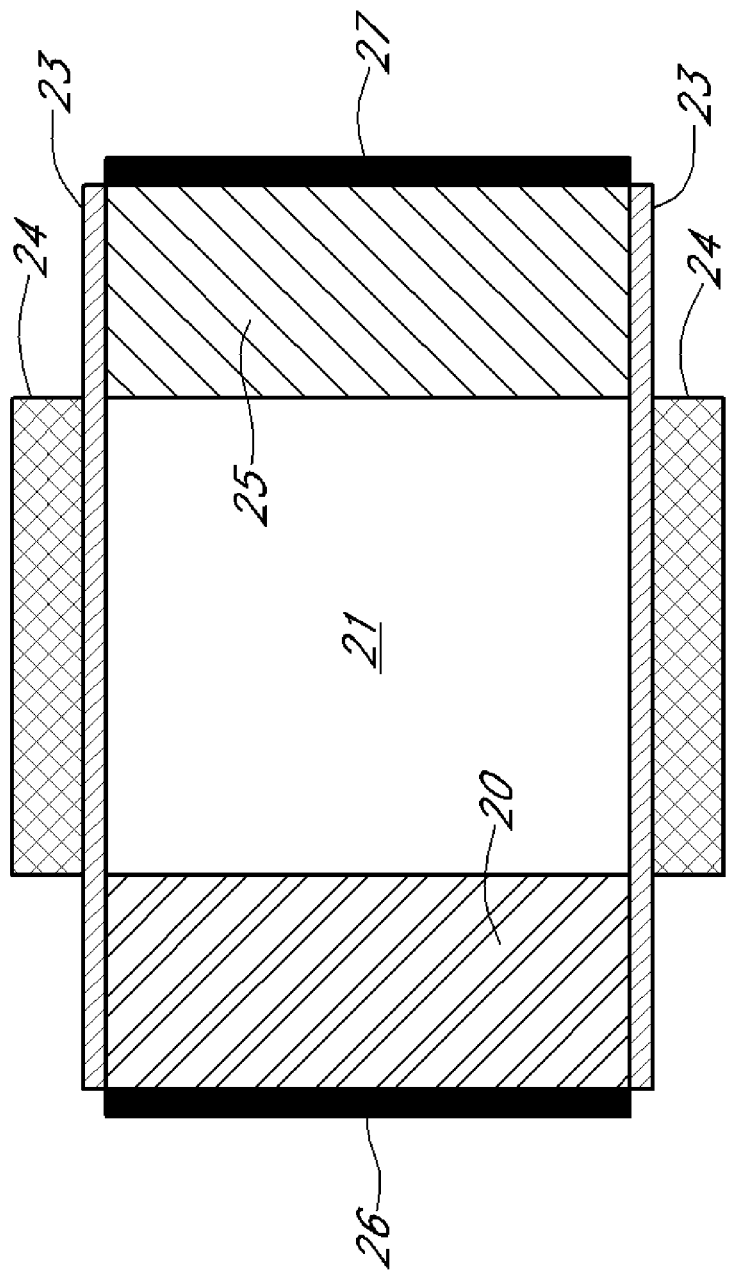
FIG. 7A shows a TFET structure used for the simulations of FIG. 7B, including source region 20, channel region 21, gate oxide 23, gate 24, heterosection 25, source contact 26, and drain contact 27. The structure is 2-dimensional and has a double-gate. The height of the central part (between the oxides) is 60 nm, and the height of the hafnium oxide is 4 nm. The width of the highly p-doped section is 30 nm, the width of the channel section is 100 nm, and the width of the highly n-doped heterosection is 30 nm. The heterosection is made of either Si or of an artificial material X which has all properties of Si but having a larger electron affinity compared to the rest of the nanowire material.

Simulations with Device Simulator MEDICI to Illustrate the Effect of Electron Affinity on a (Silicon) P-Type NW-TFET with a Highly N-Doped Heterosection The simulations are performed with device simulator "MEDICI" to illustrate the effect of electron affinity on a (silicon) p-type NW-TFET with a highly n-doped heterosection. The NW-TFET used for the simulation is shown in FIG. 7A. The NW-TFET structure is 2-dimensional and has a double-gate 24. The height of the central part (between the oxides) is 100 nm, and the height of the hafnium gate 23 oxide is 4 nm. The width of the highly p-doped source region 20 is 30 nm, the width of the channel region 21 is 100 nm, and the width of the highly n-doped heterosection 25 which forms the drain region is 30 nm. The heterosection 25 is made of either Si or of an artificial material X which has all properties of Si except for a larger electron affinity ($E_{aff,X}=4.69$ eV, instead of the correct value of $E_{aff,Si}=4.17$ eV). The doping concentrations and dopant type in the NW-TFET used to perform the simulations are summarized in Table 2.

TABLE 2

Doping concentrations and dopant type in the NW-TFET used to perform the simulations.

| Nanowire region | Dopant type/ concentration | Semiconductor material |
| --- | --- | --- |
| Source region | p-type, $10^{20}$/cc | Si |
| Channel region | n-type, $10^{13}$/cc | Si |
| Heterosection drain region | n-type, $10^{20}$/cc | Si or artificial material X |

Figure 7B:
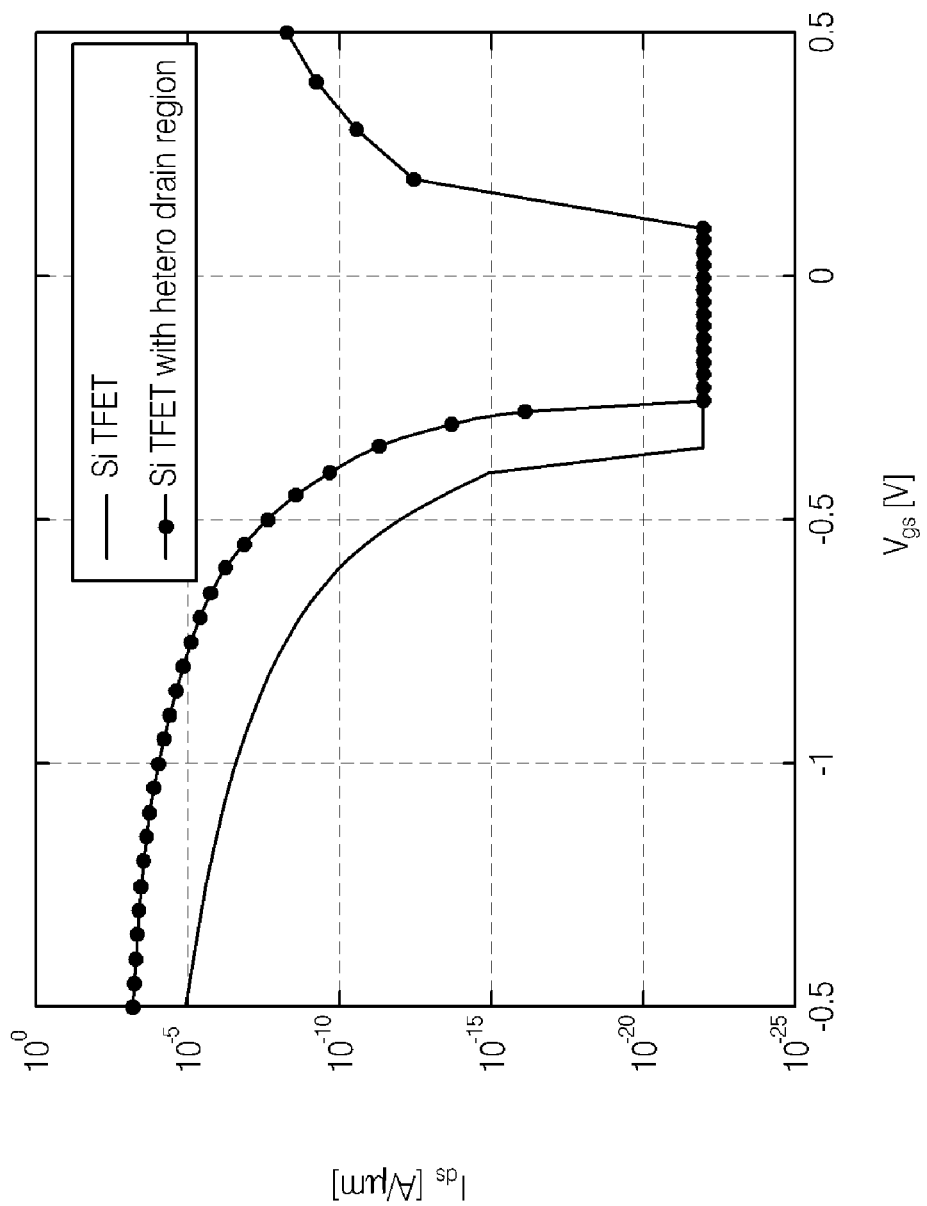
FIG. 7B illustrates the source-drain current $I_{ds}$ as a function of gate voltage $V_{gate}$ for the TFET structure as shown in FIG. 7A with a Si heterosection and a heterosection made of an artificial material X having a larger electron affinity than the rest of the nanowire material. The voltage $V_{ds}$=1 V for all curves.
Figure 8:
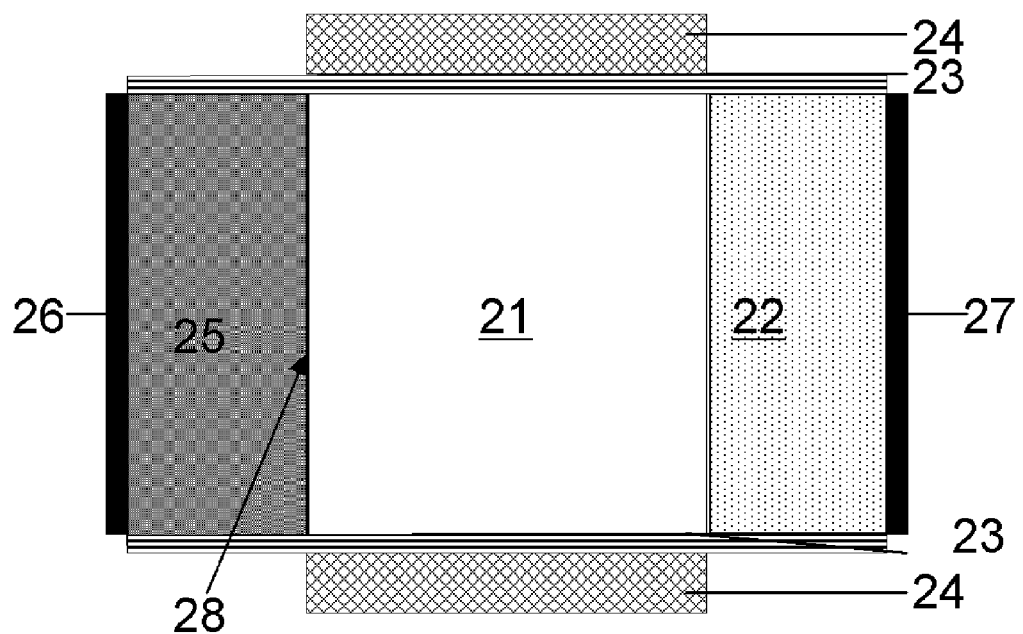
FIG. 8 shows a TFET structure including channel region 21, drain region 22, gate oxide 23, gate 24, heterosection 25, source contact 26, drain contact 27 and interface 28 between a main part 21 of the elongate monocrystalline nanostructure and the heterosection 25.
Figure 9:
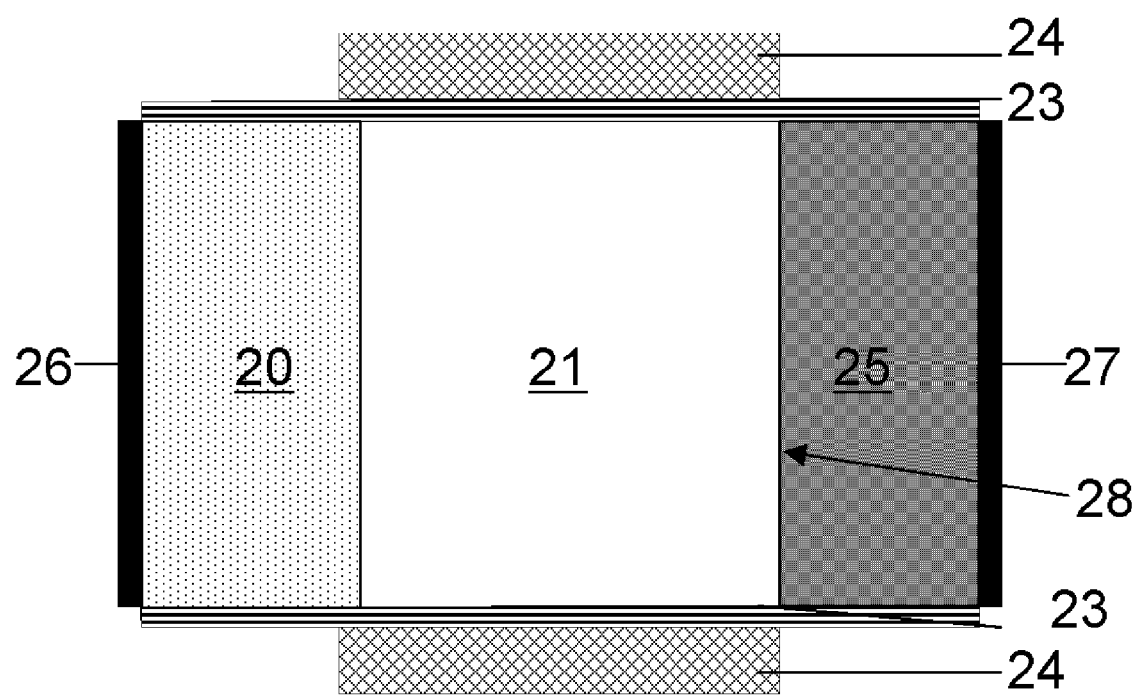
FIG. 9 shows a TFET structure including source region 20, channel region 21, gate oxide 23, gate 24, heterosection 25, source contact 26, drain contact 27 and interface 28 between a main part 21 of the elongate monocrystalline nanostructure and the heterosection 25.

The electrical characteristics of the NW-TFET structure as shown in FIG. 7A are presented in FIG. 7B. It can be observed that for the NW-TFET with the artificial X heterosection, a higher on-current and a steeper subthreshold slope are achieved than for the all-Si NW-TFET. This is due to the fact that the tunnel barrier width decreases because the electron affinity of the artificial material X in the heterosection drain region is larger than the electron affinity of Si in the channel region. The simulations of FIG. 7B therefore illustrate that even when the bandgap of the material of the heterosection is the same as the bandgap of the main part of the nanowire, the on-current of the NW-TFET can be improved with a heterosection with an appropriate electron affinity. The simulations further illustrate that in case of an n-doped heterosection which forms part of the drain region of a p-type NW-TFET, the electron affinity of the heterosection is for example larger than the electron affinity of the main part of the nanowire.

As has been described above, tunnel field-effect transistors (TFETs) are regarded as successors of metal-oxide semiconductor field-effect transistors (MOSFETs), but silicon-based TFETs typically suffer from low on-currents, a drawback related to the large resistance of the tunnel barrier. To achieve higher on-currents a TFET with a germanium (Ge) heterosection acting as source (drain) region is used. A nanowire-based structure with a heterosection (9) is introduced such that the lattice mismatch between silicon and germanium does not result in a highly defective interface. A dynamic power reduction as well as a static power reduction can result, compared to conventional MOSFET configurations. Multiple layers of logic can therefore be envisioned with these nanowire Si/Ge TFETs resulting in ultra-high on-chip transistor densities.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

What is claimed is:

1. A method for manufacturing a tunnel field effect transistor, comprising:
providing a substrate lying in a plane;
growing an elongate monocrystalline nanostructure on the substrate, the elongate monocrystalline nanostructure having an integrated drain region or source region, the elongate monocrystalline nanostructure further having a channel region comprising a first semiconductor material having a first lattice constant, and a heterosection comprising a second semiconductor material having a different lattice constant from the first semiconductor material, wherein the heterosection acts as an source region or drain region;
selectively doping the drain region or source region, channel region, and heterosection to a preselected doping level and a preselected dopant type;
forming an integrated drain contact to the drain region of the elongate monocrystalline nanostructure;
depositing on side walls of the elongate monocrystalline nanostructure a gate dielectric;
depositing on top of the gate dielectric a gate contact; and
forming a source contact or drain contact on top of the heterosection of the elongate monocrystalline nanostructure, whereby a tunnel field effect transistor is obtained;
wherein at least one of the source region and drain region of the elongate monocrystalline nanostructure is situated in the first section and is highly doped according to a first conductivity type; wherein at least one of the source region and drain region of the elongate monocrystalline nanostructure is situated in the heterosection and is highly doped according to a second conductivity type, wherein an interface between a main part of the elongate monocrystalline nanostructure and the heterosection is substantially defect-free; wherein a channel region adjacent to the heterosection and comprising the first semiconductor material which is lowly doped according to the first conductivity type or lowly doped according to the second conductivity type and is situated between the source region and drain region; and wherein a gate structure is on the channel region of the elongate monocrystalline nanostructure, the gate structure comprising a gate dielectric with a gate contact on top of the gate dielectric.

2. The method of claim 1, further comprising providing a catalyst on the substrate.

3. The method of claim 1, wherein the gate dielectric is a gate oxide.

4. The method of claim 1, wherein the substrate is a Si wafer.

5. The method of claim 1, wherein forming a source contact or drain contact on top of the heterosection of the elongate monocrystalline nanostructure further comprises depositing a catalyst after forming the source contact.

6. The method of claim 1, wherein the gate structure completely covers the channel region of the elongate monocrystalline nanostructure.

7. The method of claim 1, wherein the first semiconductor material and the second semiconductor material each independently comprises at least one material selected from the group consisting of group IV materials, binary compounds of group IV materials, group III/V materials, binary compounds of group III/V materials, tertiary compounds of group III/V materials, quaternary compounds of group III/V materials, group II/VI materials, binary compounds of group II/VI materials, tertiary compounds of group II/VI materials, and quaternary compounds of group II/VI materials.

8. The method of claim 1, wherein the first semiconductor material comprises silicon.

9. The method of claim 1, wherein the second semiconductor material is germanium or $Si_{1-x}Ge_x$ with x>0.5.

10. The method of claim 1, wherein the second semiconductor material has a smaller bandgap than the first semiconductor material.

11. The method of claim 1, wherein the second semiconductor material has a smaller electron affinity than the first semiconductor material when its conductivity type is p-type, and wherein the second semiconductor material has a higher electron affinity than the first semiconductor material when its conductivity type is n-type.

12. The method of claim 1, wherein the heterosection comprises at least one material selected from the group consisting of Al, W, Ta, Ti, Ru, Pd, Rh, Re, Pt, silicides, germanides, metal-nitrides, conductive oxides, silicided metals, metal germanides, alloys, and mixtures thereof.

13. The method of claim 1, wherein a diameter of at least one elongate monocrystalline nanostructure is from about 10 nm to about 500 nm and wherein a length of at least one elongate monocrystalline nanostructure is from about 10 nm to about 1 µm.

14. The method of claim 1, wherein the gate dielectric comprises at least one material selected from the group consisting of silicon based oxide, aluminum oxide, high-k oxides, silicates, and nitrided silicates of transition metals.

15. The method of claim 1, wherein the gate dielectric is hafnium oxide.

16. The method of claim 1, wherein the gate contact comprises a conductive material and at least one material selected from the group consisting of poly silicon, poly germanium, a metal or a metal alloy, metal-nitrides, metal-silicon nitrides, conductive oxides, fully silicided metals, fully germanided metals, workfunction tunable metals, and engineered materials selected to obtain a particular gate workfunction.

17. The method of claim 1, further comprising providing an electrical contact on at least one of the heterosection, the source region, and the drain region, wherein the electrical contact comprises a conductive material and at least one material selected from the group consisting of a silicide containing structure, a germanide containing structure, a metal containing structure, a poly silicon, and combinations thereof.

18. The method of claim 1, wherein a length of the channel region is from about 1 nm to about 1000 nm and wherein a thickness of the gate dielectric is from about 0.5 nm to about 20 nm.

19. The method of claim 1, wherein a doping level of the heterosection, the source region, and the drain region is from about $10^{18}$/cc to about $10^{21}$/cc and wherein a doping level of the channel region is up to about $10^{16}$/cc doping.

* * * * *

UNITED STATES PATENT AND TRADEMARK OFFICE
CERTIFICATE OF CORRECTION

PATENT NO. : 8,148,220 B2  Page 1 of 1
APPLICATION NO. : 13/286936
DATED : April 3, 2012
INVENTOR(S) : Verhulst et al.

It is certified that error appears in the above-identified patent and that said Letters Patent is hereby corrected as shown below:

| Column | Line | Description of Discrepancy |
|---|---|---|
| 3 | 49 | Change "20 nm" to --20 nm.--. |
| 5 | 16 | Change "nano structure" to --nanostructure,--. |
| 12 | 33 | Change "Band" to --8 and--. |
| 13 | 23 | Change "$5.10^2$/cc." to --$5.10^{20}$/cc.--. |

Signed and Sealed this
Fourteenth Day of August, 2012

David J. Kappos
*Director of the United States Patent and Trademark Office*